(12) United States Patent
Kwak et al.

(10) Patent No.: US 12,273,021 B2
(45) Date of Patent: Apr. 8, 2025

(54) GATE DRIVING TECHNIQUE TO LOWER SWITCH ON-RESISTANCE IN SWITCHING CONVERTER APPLICATIONS

(71) Applicant: QUALCOMM Incorporated, San Diego, CA (US)

(72) Inventors: Taewoo Kwak, San Diego, CA (US); Joseph Dale Rutkowski, Chandler, AZ (US); Sugato Mukherjee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/421,175

(22) Filed: Jan. 24, 2024

(65) Prior Publication Data

US 2024/0171060 A1     May 23, 2024

Related U.S. Application Data

(62) Division of application No. 17/349,687, filed on Jun. 16, 2021, now Pat. No. 11,916,470.

(60) Provisional application No. 63/085,341, filed on Sep. 30, 2020.

(51) Int. Cl.
  *H02M 1/08*   (2006.01)
(52) U.S. Cl.
  CPC ..................... *H02M 1/08* (2013.01)
(58) Field of Classification Search
  CPC ........................................................ H02M 1/08
  See application file for complete search history.

(56) References Cited

U.S. PATENT DOCUMENTS

| | | |
|---|---|---|
| 10,594,210 B1 | 3/2020 | Mercer et al. |
| 10,642,306 B1 | 5/2020 | Shankar |
| 10,790,818 B1 | 9/2020 | Frank |
| 2012/0182049 A1 | 7/2012 | Garbossa et al. |

(Continued)

FOREIGN PATENT DOCUMENTS

JP     2012147625 A     8/2012

OTHER PUBLICATIONS

International Preliminary Report On Patentability—PCT/US2021/071316—The International Bureau of WIPO—Geneva, Switzerland—Apr. 13, 2023.

(Continued)

*Primary Examiner* — Alex Torres-Rivera
(74) *Attorney, Agent, or Firm* — Patterson & Sheridan, L.L.P.

(57) ABSTRACT

Techniques and apparatus for driving transistor gates of a switched-mode power supply (SMPS) circuit. One example power supply circuit generally includes a switching converter having a switching transistor and a gate driver having an output coupled to a gate of the switching transistor. The gate driver includes a first switching device coupled between the output of the gate driver and a first voltage rail; a second switching device coupled between the output of the gate driver and a voltage node of the gate driver; a third switching device coupled between the voltage node of the gate driver and a second voltage rail; and a voltage clamp coupled in series with a fourth switching device, the voltage clamp and the fourth switching device being coupled between a third voltage rail and the voltage node (or the output of the gate driver).

7 Claims, 9 Drawing Sheets

(56) References Cited

U.S. PATENT DOCUMENTS

| | | | |
|---|---|---|---|
| 2016/0072382 A1* | 3/2016 | Ranmuthu | H02M 3/07 363/60 |
| 2018/0316345 A1 | 11/2018 | Kwak et al. | |
| 2020/0076306 A1 | 3/2020 | Pullen et al. | |
| 2021/0006244 A1 | 1/2021 | Takizawa et al. | |
| 2022/0103073 A1 | 3/2022 | Kwak et al. | |

OTHER PUBLICATIONS

International Search Report and Written Opinion—PCT/US2021/071316—ISA/EPO—Dec. 21, 2021.

* cited by examiner

GATE DRIVING TECHNIQUE TO LOWER SWITCH ON-RESISTANCE IN SWITCHING CONVERTER APPLICATIONS

CROSS-REFERENCE TO RELATED APPLICATION

This application is a divisional of U.S. patent application Ser. No. 17/349,687, filed Jun. 16, 2021, which claims the benefit of priority to U.S. Provisional Application No. 63/085,341, filed Sep. 30, 2020, which are expressly incorporated by reference herein in their entirety as if fully set forth below and for all applicable purposes.

TECHNICAL FIELD

Certain aspects of the present disclosure generally relate to electronic circuits and, more particularly, to a driver architecture for switched-mode power supplies.

BACKGROUND

A voltage regulator ideally provides a constant direct current (DC) output voltage regardless of changes in load current or input voltage. Voltage regulators may be classified as linear regulators or switching regulators. While linear regulators tend to be small and compact, many applications may benefit from the increased efficiency of a switching regulator (also referred to as a "switching converter"). A linear regulator may be implemented by a low-dropout (LDO) regulator, for example. A switching regulator may be implemented by a switched-mode power supply (SMPS), such as a buck converter, a boost converter, a buck-boost converter, or a charge pump.

For example, a buck converter is a type of SMPS typically comprising: (1) a high-side switch coupled between a relatively higher voltage rail and a switching node, (2) a low-side switch coupled between the switching node and a relatively lower voltage rail, (3) and an inductor coupled between the switching node and a load (e.g., represented by a shunt capacitive element). The high-side and low-side switches are typically implemented with transistors, although the low-side switch may alternatively be implemented with a diode.

A charge pump is a type of SMPS typically comprising at least one switching device to control the connection of a supply voltage across a load through a capacitor. In a voltage doubler, for example, the capacitor of the charge pump circuit may initially be connected across the supply, charging the capacitor to the supply voltage. The charge pump circuit may then be reconfigured to connect the capacitor in series with the supply and the load, doubling the voltage across the load. This two-stage cycle is repeated at the switching frequency for the charge pump. Charge pumps may be used to multiply or divide voltages by integer or fractional amounts, depending on the circuit topology.

Power management integrated circuits (power management ICs or PMICs) are used for managing the power requirement of a host system and may include and/or control one or more voltage regulators (e.g., buck converters or charge pumps). A PMIC may be used in battery-operated devices, such as mobile phones, tablets, laptops, wearables, etc., to control the flow and direction of electrical power in the devices. The PMIC may perform a variety of functions for the device such as DC-to-DC conversion (e.g., using a voltage regulator as described above), battery charging, power-source selection, voltage scaling, power sequencing, etc.

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects of the present disclosure provide a power supply circuit. The power supply circuit generally includes a switching converter having a switching transistor and a gate driver having an output coupled to a gate of the switching transistor. The gate driver includes a first switching device coupled between the output of the gate driver and a first voltage rail; a second switching device coupled between the output of the gate driver and a voltage node of the gate driver; a third switching device coupled between the voltage node of the gate driver and a second voltage rail; and a voltage clamp coupled in series with a fourth switching device, the voltage clamp and the fourth switching device being coupled between the voltage node and a third voltage rail.

Certain aspects of the present disclosure provide a power supply circuit. The power supply circuit generally includes a switching converter having a switching transistor and a gate driver having an output coupled to a gate of the switching transistor. The gate driver includes a first switching device coupled between the output of the gate driver and a first voltage rail; a second switching device coupled between the output of the gate driver and a voltage node of the gate driver; a third switching device coupled between the voltage node of the gate driver and a second voltage rail; and a voltage clamp coupled in series with a fourth switching device, the voltage clamp and the fourth switching device being coupled between a third voltage rail and the output of the gate driver.

Certain aspects of the present disclosure provide a power supply circuit. The power supply circuit generally includes a switching converter having a switching transistor and a gate driver having an output coupled to a gate of the switching transistor. The gate driver includes a first switching device coupled between the output of the gate driver and a first voltage rail; a second switching device coupled between the output of the gate driver and a voltage node of the gate driver; a third switching device coupled between the voltage node of the gate driver and a second voltage rail; and a voltage clamp coupled in series with a fourth switching device, the voltage clamp and the fourth switching device being coupled between a third voltage rail and either the voltage node or the output of the gate driver.

Certain aspects of the present disclosure provide a power management integrated circuit (PMIC) comprising at least a portion of a power supply circuit described herein.

Certain aspects of the present disclosure provide a battery charging circuit comprising a power supply circuit described herein.

Certain aspects of the present disclosure provide a method of supplying power. The method generally includes operating a gate driver to turn on a switching transistor of a switching converter by: changing a gate voltage of the switching transistor from a first voltage to a second voltage and routing current through a first path of the gate driver; and changing the gate voltage of the switching transistor from the second voltage to a third voltage and routing current through a second path of the gate driver, different from the first path.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
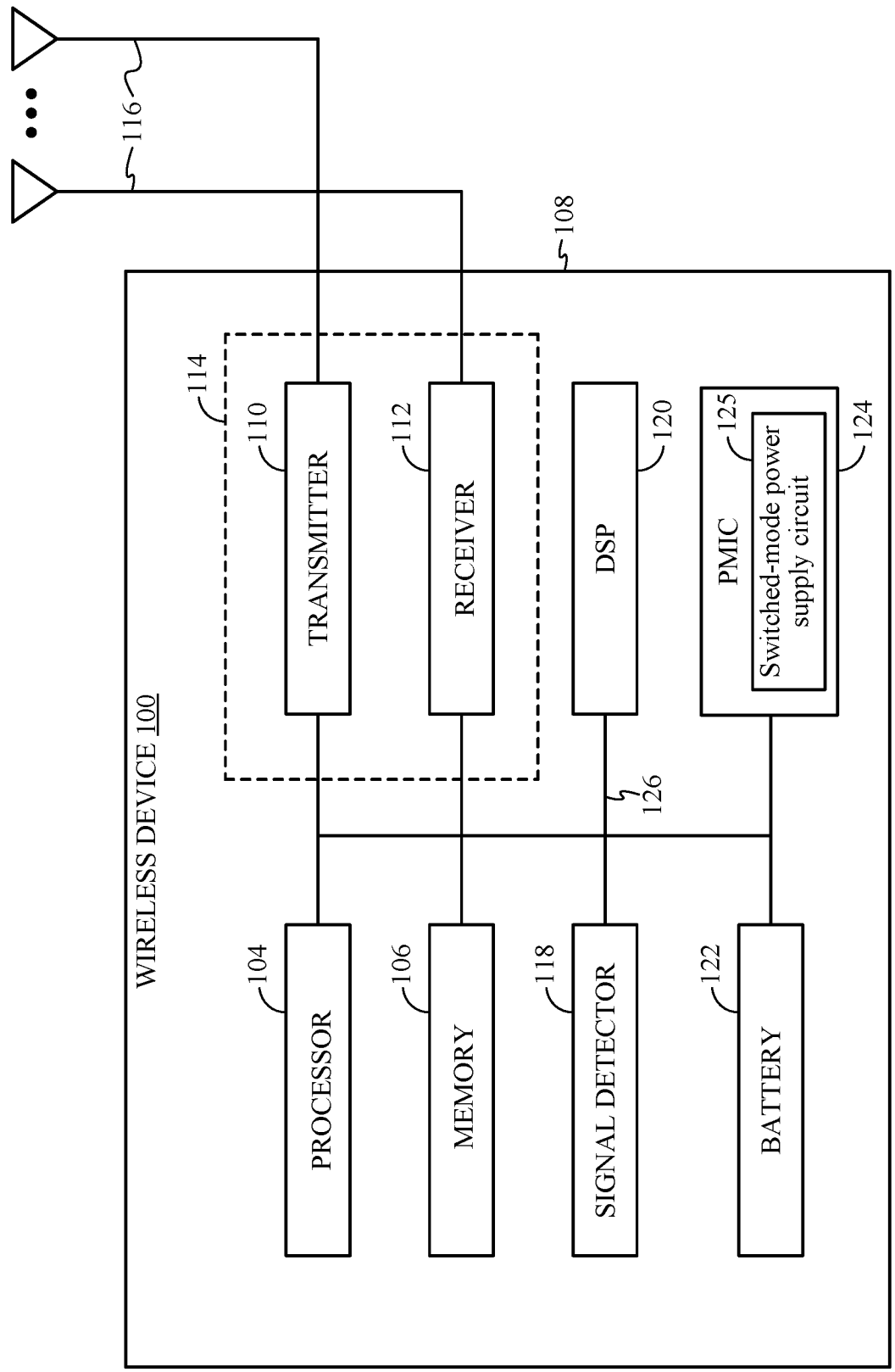
FIG. 1 is a block diagram of an example device that includes a switched-mode power supply (SMPS) circuit, in which aspects of the present disclosure may be practiced.

Certain aspects of the present disclosure provide techniques and apparatus for driving transistor gates of a switched-mode power supply (SMPS) circuit. One example technique involves pulling down (or pulling up) the gate voltage output from a gate driver to a voltage rail with a lower (or higher) voltage for greater gate-to-source voltage magnitude ($|V_{gs}|$) after a fast transient in the SMPS circuit is achieved in the Vss (or Vdd) domain.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Device

It should be understood that aspects of the present disclosure may be used in a variety of applications. Although the present disclosure is not limited in this respect, the circuits disclosed herein may be used in any of various suitable apparatus, such as in the power supply, battery charging circuit, or power management circuit of a communication system, a video codec, audio equipment such as music players and microphones, a television, camera equipment, and test equipment such as an oscilloscope. Communication systems intended to be included within the scope of the present disclosure include, by way of example only, cellular radiotelephone communication systems, satellite communication systems, two-way radio communication systems, one-way pagers, two-way pagers, personal communication systems (PCSs), personal digital assistants (PDAs), and the like.

FIG. 1 illustrates an example device 100 in which aspects of the present disclosure may be implemented. The device 100 may be a battery-operated device such as a cellular phone, a PDA, a handheld device, a wireless device, a laptop computer, a tablet, a smartphone, an Internet of Things (IOT) device, a wearable device, etc.

The device 100 may include a processor 104 that controls operation of the device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106.

In certain aspects, the device 100 may also include a housing 108 that may include a transmitter 110 and a receiver 112 to allow transmission and reception of data between the device 100 and a remote location. For certain aspects, the transmitter 110 and receiver 112 may be combined into a transceiver 114. One or more antennas 116 may be attached or otherwise coupled to the housing 108 and electrically coupled to the transceiver 114. The device 100 may also include (not shown) multiple transmitters, multiple receivers, and/or multiple transceivers.

The device 100 may also include a signal detector 118 that may be used in an effort to detect and quantify the level of signals received by the transceiver 114. The signal detector 118 may detect such signal parameters as total energy, energy per subcarrier per symbol, and power spectral density, among others. The device 100 may also include a digital signal processor (DSP) 120 for use in processing signals.

The device 100 may further include a battery 122 used to power the various components of the device 100. The device 100 may also include a power management integrated circuit (power management IC or PMIC) 124 for managing the power from the battery to the various components of the device 100. The PMIC 124 may perform a variety of functions for the device such as DC-to-DC conversion, battery charging, power-source selection, voltage scaling, power sequencing, etc. In certain aspects, the PMIC 124 may include at least a portion of a power supply circuit, which may include a switched-mode power supply circuit 125. The switched-mode power supply circuit 125 may be implemented by any of various suitable switched-mode power supply circuit topologies, such as a buck converter, a boost converter, an inverting buck-boost converter, or a charge pump. For certain aspects, the PMIC 124 may include a battery charging circuit (e.g., a master-slave battery charging circuit). For certain aspects, the power supply circuit may include a driver architecture with gate-driving assistance (e.g., a gate driving helper circuit), as described below.

The various components of the device 100 may be coupled together by a bus system 126, which may include a power bus, a control signal bus, and/or a status signal bus in addition to a data bus.

Example Power Supply Circuit with a Gate Driver and a Switching Circuit

Figure 2A:
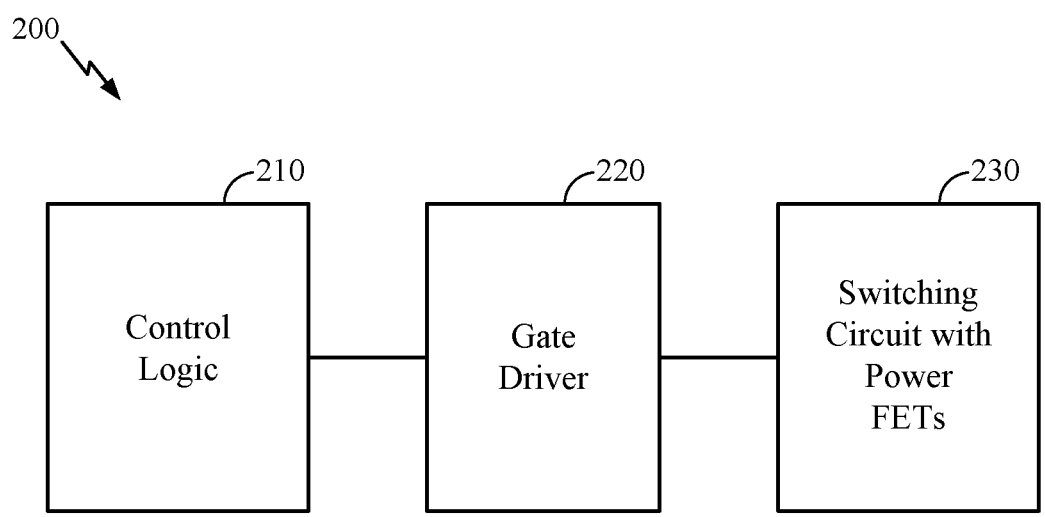
FIG. 2A is a block diagram of an example power supply circuit, in which aspects of the present disclosure may be practiced.

FIG. 2A is a block diagram of an example power supply circuit 200, in which aspects of the present disclosure may be practiced. The power supply circuit 200 may include control logic 210, a gate driver 220, and a switching circuit 230. The control logic 210 may output control signals to control the timing of components in the gate driver 220. The gate driver 220 may output signals with specified output signal swings to control the control inputs (e.g., the gates) of switching devices (e.g., power field-effect transistors (FETs)) in the switching circuit 230.

Figure 2B:
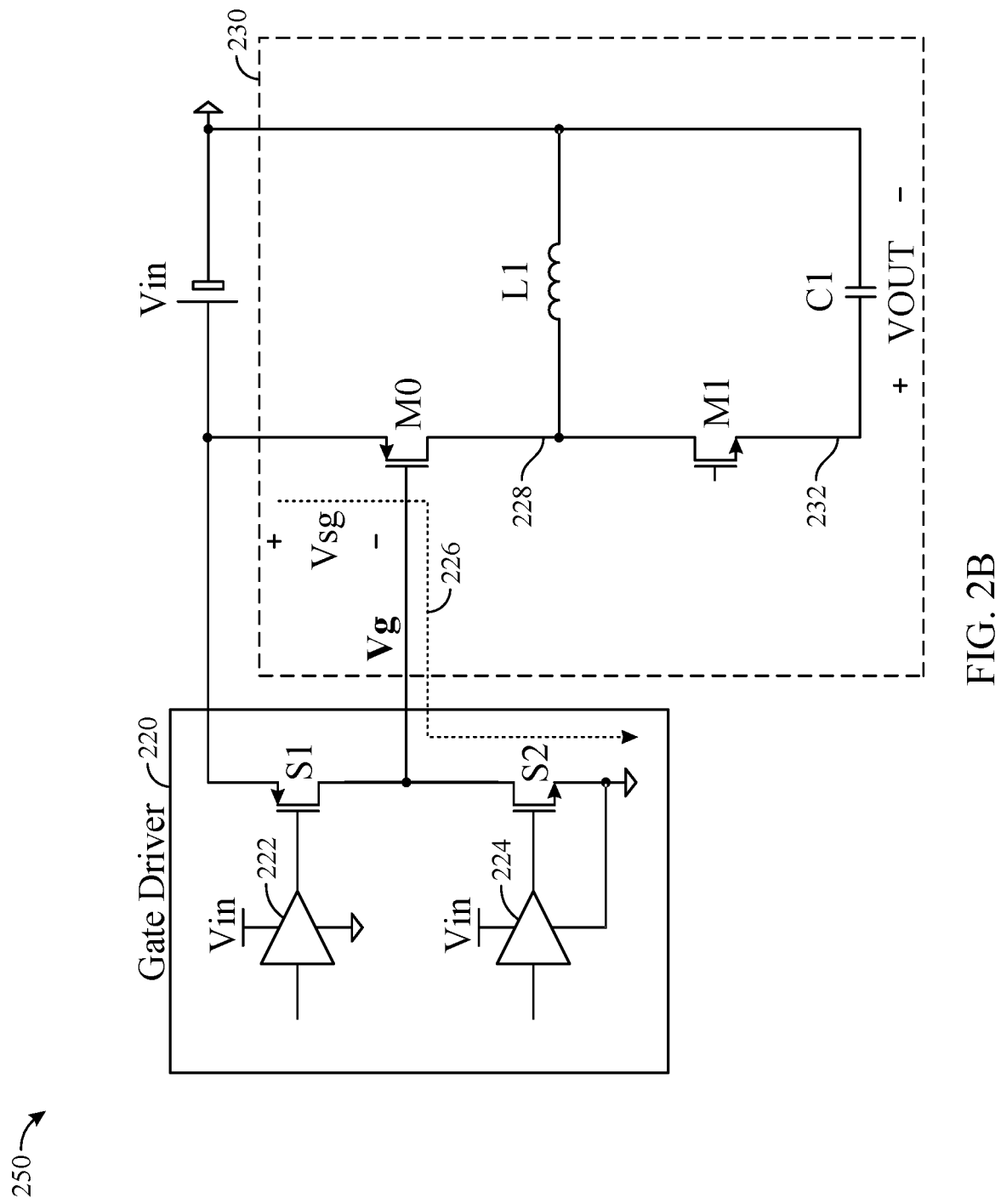
FIG. 2B is a circuit diagram of an example gate driver and an example inverting buck-boost converter, in which aspects of the present disclosure may be practiced.

FIG. 2B is a circuit diagram 250 of a portion of an example gate driver 220 and an example switching circuit 230, in which aspects of the present disclosure may be practiced. The gate driver 220 may include logic buffers 222, 224 and switches S1, S2. Logic buffer 222 may have an input coupled to an output of the control logic 210 and may have an output coupled to a control input of switch S1. In this example, switch S1 is implemented as a p-type field-effect transistor (PFET) having a source coupled to a first voltage rail (labeled "Vin"), having a gate coupled to the output of logic buffer 222, and having a drain coupled to an output node (labeled "Vg") of this portion of the gate driver 220. Logic buffer 224 may have an input coupled to another output of the control logic 210 and may have an output coupled to a control input of switch S2. In this example, switch S2 is implemented as an n-type field-effect transistor (NFET) having a drain coupled to the output node of this portion of the gate driver 220, having a gate coupled to the output of logic buffer 224, and having a source coupled to a second voltage rail (e.g., electrical ground) with a lower voltage than the first voltage rail. The power supply inputs of logic buffers 222, 224 may be coupled to the first and second voltage rails, as depicted in FIG. 2B.

In this example, the switching circuit 230 is implemented as an inverting buck-boost converter. However, it is to be understood that the switching circuit may alternatively be implemented as any of other various suitable switching converter topologies, such as a boost converter. As illustrated, the inverting buck-boost converter includes power transistors M0, M1, an inductive element L1 (e.g., implemented by one or more inductors), and a capacitive element C1 (e.g., implemented by one or more capacitors). The transistor M0 is a PFET having a source coupled to the first voltage rail, having a gate coupled to an output of the gate driver 220 (namely, output node Vg), and having a drain coupled to a switching node 228. The transistor M1 is an NFET having a drain coupled to the switching node 228, having a gate coupled to another output of the gate driver 220 (not shown), and having a source coupled to an output node 232 of the inverting buck-boost converter. The portion of the gate driver 220 for controlling the control input of transistor M1 is not illustrated, but may be implemented in a similar manner to that described above. For certain aspects, transistor M1 may be replaced with another suitable component, such as a diode with an anode coupled to the output node 232 and a cathode coupled to the switching node 228.

A first terminal of the inductive element L1 is coupled to the switching node 228, and a second terminal of the inductive element L1 is coupled to the second voltage rail. A first terminal of the capacitive element C1 is coupled to the output node 232, and a second terminal of the capacitive element C1 is coupled to the second voltage rail. The output voltage (labeled "VOUT") of the inverting buck-boost converter is developed across the capacitive element C1, as shown. In an inverting buck-boost converter, VOUT generally has opposite polarity of Vin and is adjustable based on the duty cycle of switching transistors M0 and M1.

During operation, logic buffers 222, 224 may receive control signals from the control logic (e.g., lower logic-level signals) and output signals for driving the control inputs (e.g., the gates) of switches S1, S2. In certain aspects, the buffer output signals may have higher voltage swings than the control signals received from the control logic 210. In this manner, the output signal from the gate driver 220 on the output node Vg may be pulled down to logic low (e.g., to the second voltage rail) to turn on power transistor M0 and may be pulled up to logic high (e.g., to the first voltage rail) to turn off transistor M0, according to the switching frequency and duty cycle of the inverting buck-boost converter. Likewise, another output signal from the gate driver 220 may be used to control operation of the power transistor M1, where the gate may be pulled up to logic high to turn on transistor M1 and may be pulled down to logic low to turn off transistor M1. The gate signals may be operated in a break-before-make fashion, such that transistor M0 is turned off before transistor M0 is turned on, and vice versa. As explained above, VOUT is controlled based on the duty cycle of switching the power transistors M0 and M1.

Certain applications of power supply circuits in portable devices (e.g., device 100) may demand relatively high load current at VOUT, even with low battery voltages (Vin), with minimal impact on die area. This may involve high current driving to charge and discharge the gate capacitances of the switching transistor M0 through switches S1 and S2 in the gate driver 220, with an example charging path 226 shown in FIG. 2B. One way to provide high current driving is to increase the size of the switching transistor(s) (e.g., power transistors M0, M1) in the switching circuit 230 and lower the drain-to-source on-resistance ($R_{ds,on}$) of the switching transistor(s). However, increasing the size of the switching transistor(s) can significantly increase the area occupied by the power supply circuit. Furthermore, the large transistor size may increase the gate capacitance, which may result in more switching loss and lower light load efficiency.

Example Gate Driver for Reduced Switching Transistor On-Resistance

Certain aspects of the present disclosure provide apparatus and techniques for driving gates of power transistors in a switching regulator with sufficiently high gate charging current, even at lower voltages (e.g., low battery voltage). This may be accomplished by introducing another voltage domain, in addition to the first and second voltage rails. By providing an additional voltage domain, higher gate-to-source voltage magnitude may be achieved, thereby reducing the drain-to-source on-resistance ($R_{ds,on}$) of a switching transistor in the switching regulator driven by the gate driver and decreasing the conduction loss through the switching transistor. Certain aspects achieve this higher current-driving capability with a small impact on the die area of the gate driver integrated circuit (IC).

Figure 3A:
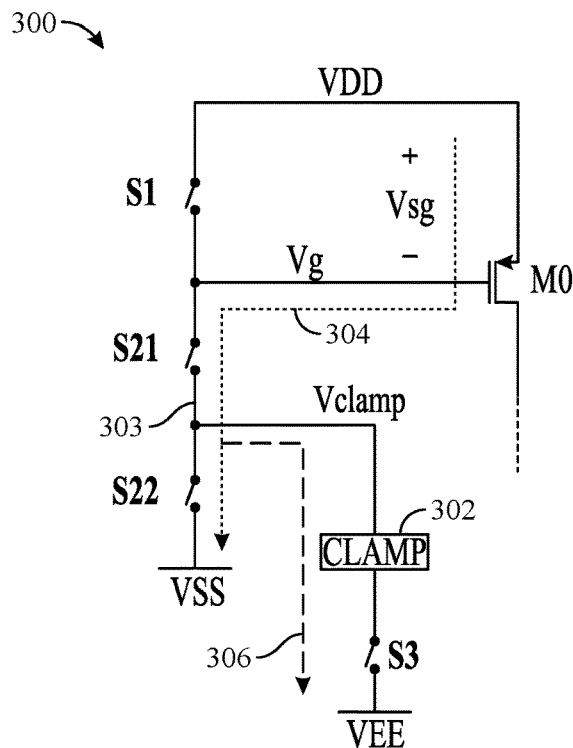
FIGS. 3A and 3C are circuit diagrams for a portion of an example gate driver for a p-type transistor of a switching converter, in accordance with certain aspects of the present disclosure.
Figure 5:
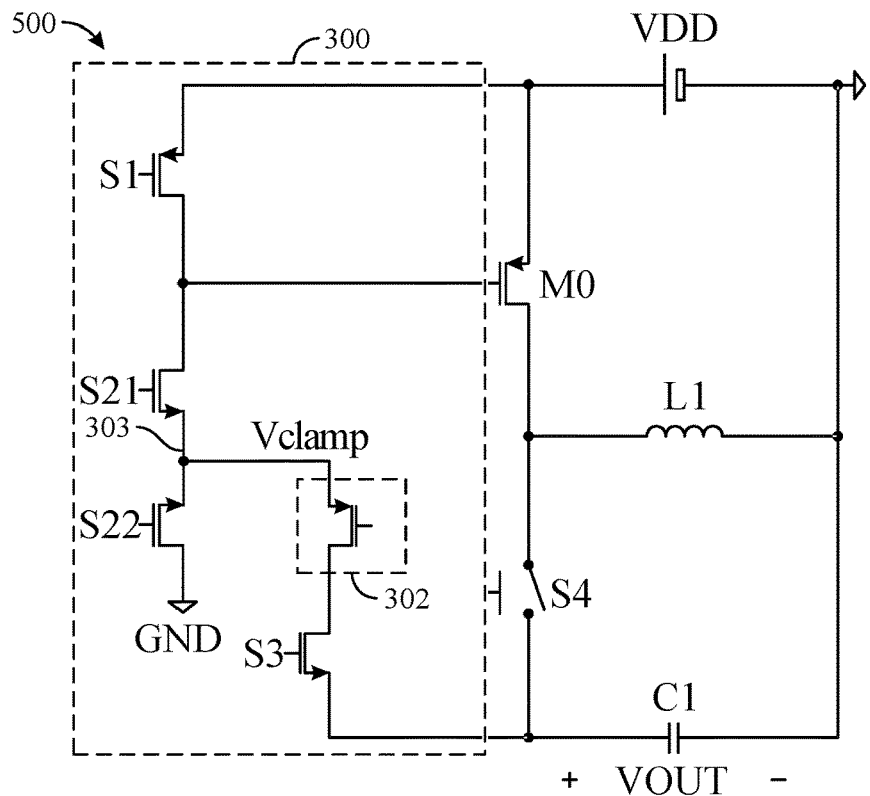
FIGS. 5 and 6 are schematic diagrams of example switching converter applications using the gate drivers of FIGS. 3A and 4A, respectively, in accordance with certain aspects of the present disclosure.

FIG. 3A is a circuit diagram of a portion of an example gate driver 300 for a p-type transistor (M0) of a switching converter, in accordance with certain aspects of the present disclosure. The gate driving circuit includes switches S1, S21, S22, and S3 and a voltage clamp 302 (labeled "Vclamp"). The switches S1, S21, S22, and S3 and the voltage clamp 302 may be implemented by transistors (as illustrated in FIG. 5). Switch S1 is coupled between the first voltage rail (labeled "VDD" here) and the gate driver output node Vg. Switches S21 and S22 in FIG. 3A replace switch S2 of FIG. 2B. Switches S21 and S22 are coupled in series between the output node Vg and the second voltage rail (labeled "VSS" here) and share a common voltage node 303. The voltage clamp 302 and switch S3 are coupled in series between the common voltage node 303 and a third voltage rail (labeled "VEE"). The voltage clamp 302 and switch S3 provide the gate-driving assistance to increase the source-to-gate voltage ($V_{sg}$) and reduce the switch ON resistance (e.g., the on-resistance of transistor M0) when switch S3 is closed.

Figure 3B:
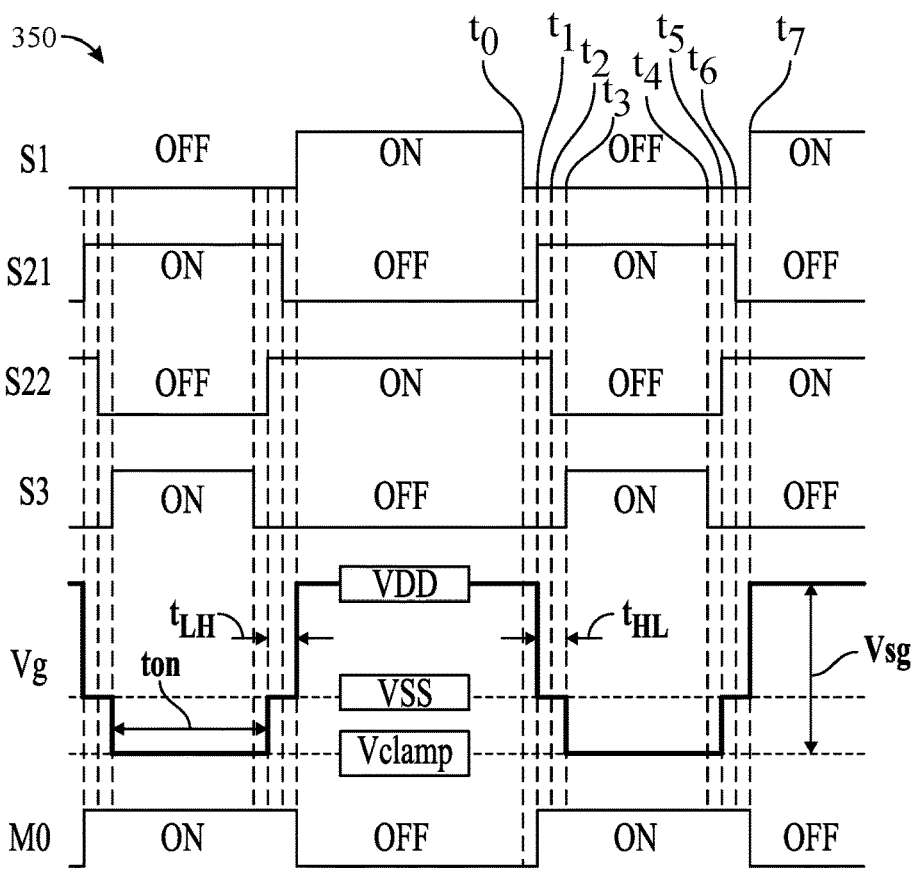
FIG. 3B is an example timing diagram for the portion of the gate driver of FIG. 3A, in accordance with certain aspects of the present disclosure.

FIG. 3B is an example timing diagram 350 for the portion of the gate driver 300 of FIG. 3A, in accordance with certain aspects of the present disclosure. After an initial fast transient is achieved between the VDD and VSS domains during a high-to-low transition interval ($t_{HL}$) for the gate voltage to turn on transistor M0, the transistor M0 $R_{ds,on}$ becomes smaller by further pulling down the gate voltage of transistor M0 from VSS to Vclamp (<VSS) using the voltage clamp 302 during the on-time ($t_{on}$) for gate assistance, where Vclamp is the voltage at common voltage node 303. $V_{sg}$ of transistor M0 should be clamped below its voltage rating ($V_{sg,max}$) by the clamping circuit (voltage clamp 302) (e.g., VDD−Vclamp<$V_{sg,max}$). Vclamp may be referenced to VDD such that Vclamp is VDD minus the clamping voltage of the voltage clamp 302.

The sequence for turning on power transistor M0 from an OFF state using the gate driver 300 is as follows. At $t_0$, the control signal for switch S1 transitions to change switch S1 from the ON state to the OFF state, such that switch S1 is opened. At $t_1$, the control signal for switch S21 transitions to change switch S21 from the OFF state to the ON state, such that switch S21 is closed. Because switch S22 is already closed at $t_1$, transistor M0 turns on, with gate driving current flowing temporarily along charging path 304 from the first voltage rail (VDD) through transistor M0 and switches S21 and S22 to the second voltage rail (VSS). This also pulls the gate voltage at the output node Vg down from VDD to VSS as a fast transient at $t_1$, beginning the $t_{HL}$ interval. At $t_2$, the control signal for switch S22 transitions to change switch S22 from the ON state to the OFF state, such that switch S22 is opened. At $t_3$, the control signal for switch S3 is asserted to change switch S3 from the OFF state to the ON state, such that switch S3 is closed. This routes the gate driving current along the charging path 306 through transistor M0, switch S21, the voltage clamp 302, and switch S3, pulling the gate voltage at node Vg down even further from VSS to Vclamp, where Vclamp is between VSS and VEE. The lowering of the gate voltage to Vclamp at $t_3$ increases the Vsg (=VDD−Vclamp) and lowers the on-resistance of transistor M0 and ends the $t_{HL}$ interval.

The turn-on sequence (e.g., switch S1 opened→switch S21 closed→switch S22 opened→switch S3 closed) is opposite to the turn-off sequence (e.g., switch S3 opened-→switch S22 closed→switch S21 opened→switch S1 closed) for transistor M0. The sequence for turning off power transistor M0 from an ON state using the gate driver 300 is as follows. At $t_4$, the control signal for switch S3 is deasserted to change switch S3 from the ON state to the OFF state, such that switch S3 is opened. The gate voltage at node Vg remains at or near Vclamp. At $t_5$, the control signal for switch S22 transitions to change switch S22 from the OFF state to the ON state, such that switch S22 is closed. Closing switch S22 at $t_5$ changes the gate voltage at node Vg from Vclamp to VSS, ends the period for gate assistance ($t_{on}$), and starts a low-to-high transition interval ($t_{LH}$) for the gate voltage to turn off transistor M0. At $t_6$, the control signal for switch S21 transitions to change switch S21 from the ON state to the OFF state, such that switch S21 is opened. At $t_7$, the control signal for switch S1 is asserted to change switch S1 from the OFF state to the ON state, such that switch S1 is closed. Closing switch S1 raises the gate voltage at node Vg to VDD and, thus, turns off p-type transistor M0, transitioning transistor M0 from the ON state to the OFF state and ending the $t_{LH}$ interval.

The voltage clamp 302 may be implemented by any suitable voltage clamping circuit, without the burden of high current driving because the initial high current spike (i.e., the fast transient at $t_1$) to charge the gate capacitance of transistor M0 goes to the VSS domain (e.g., electrical ground), which may most likely be low impedance. Therefore, a large capacitor need not be included in the clamping circuit. The gate driving assistance circuit (also referred to as the "helper circuit") may be disabled (e.g., by opening switch S3 and/or disabling the voltage clamp 302) to reduce switching loss when sufficient $V_{sg}$ is available from high VDD or when meaningful $V_{sg}$ increase is unavailable due to low absolute value of VEE (|VEE|).

Figure 3C:
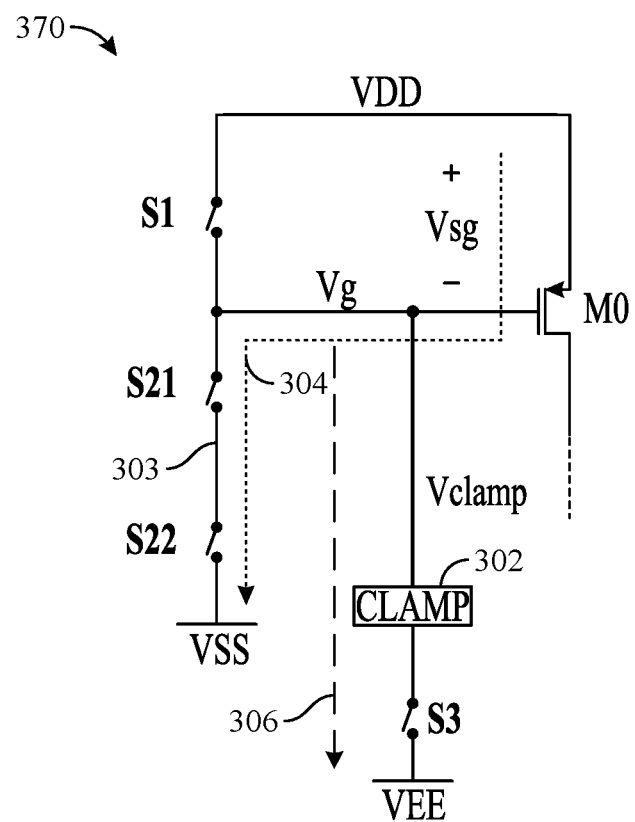

FIG. 3C is a circuit diagram of a portion of another example gate driver 370 for a p-type transistor (M0) of a switching converter, in accordance with certain aspects of the present disclosure. The gate driver 370 is similar to the gate driver 300 of FIG. 3A, but in this case, the voltage clamp 302 and switch S3 are coupled in series between the gate driver output node Vg and the third voltage rail (labeled "VEE"). The voltage clamp 302 and switch S3 provide the gate-driving assistance to increase $V_{sg}$ and reduce the switch ON resistance (e.g., the on-resistance of transistor M0) when switch S3 is closed. The example timing diagram 350 of FIG. 3B and the description thereof may also apply to the portion of the gate driver 370 of FIG. 3C.

Figure 4A:
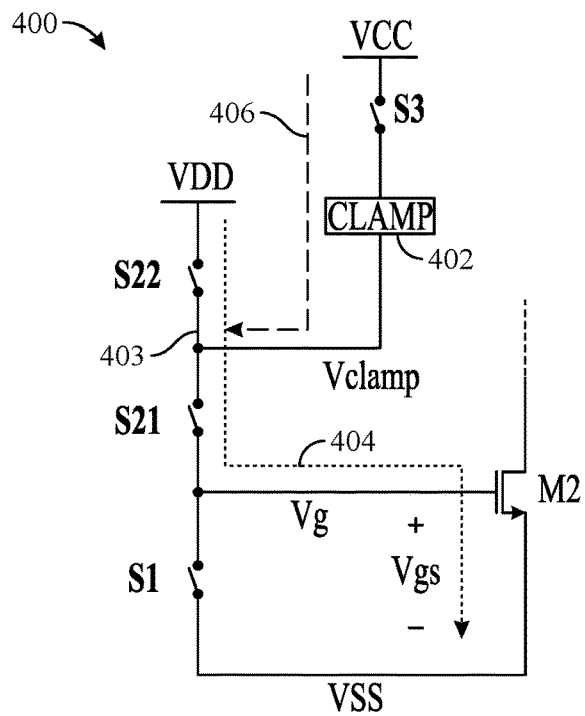
FIGS. 4A and 4C are circuit diagrams for a portion of an example gate driver for an n-type transistor of a switching converter, in accordance with certain aspects of the present disclosure.
Figure 6:
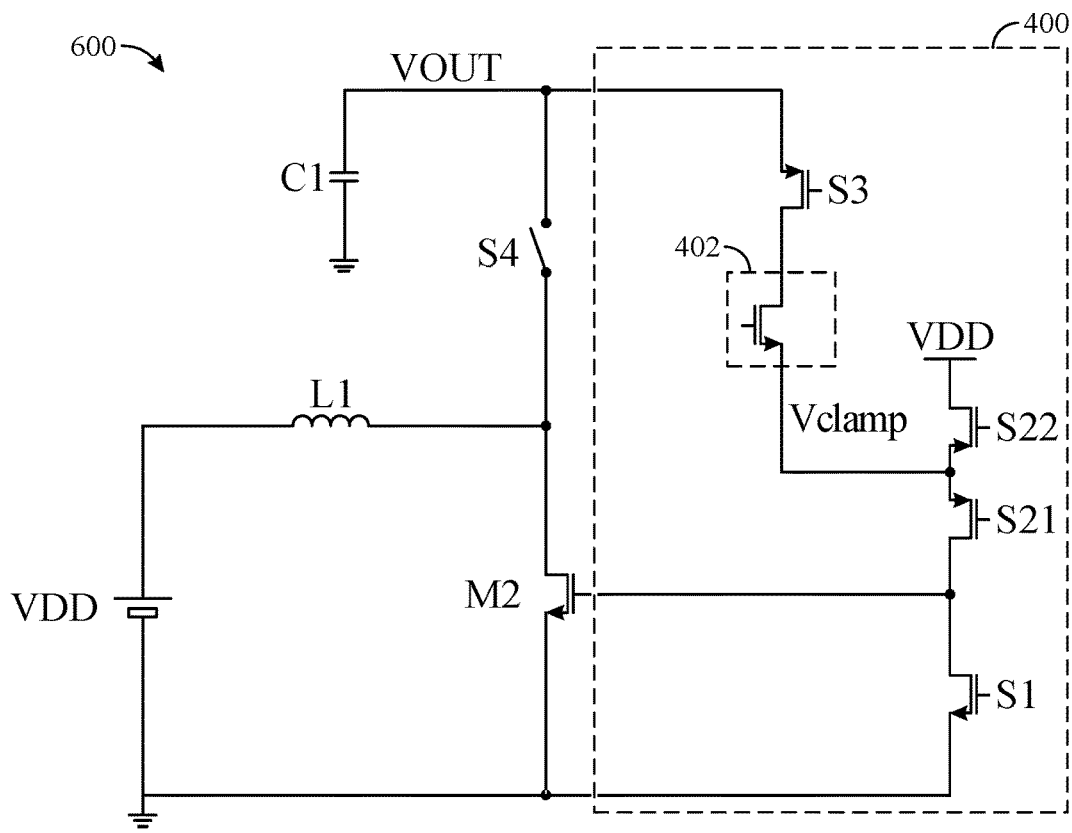

FIG. 4A is a circuit diagram for a portion of an example gate driver 400 for an n-type transistor (M2) of a switching converter, in accordance with certain aspects of the present disclosure. The gate driver 400 for the positive voltage domain is the counterpart of the gate driver 300 of FIG. 3A for the negative voltage domain. For example, the gate driver 400 may be utilized to drive the gate of a transistor in a charge pump or the low-side NFET in a buck converter or a boost converter. The gate driver 400 includes switches S1, S21, S22, and S3 and a voltage clamp 402 (labeled "Vclamp"). The switches S1, S21, S22, and S3 and the voltage clamp 402 may be implemented by transistors (as illustrated in FIG. 6). Switch S1 is coupled between a first voltage rail (VSS in this case) and the gate driver output node Vg. Switches S21 and S22 are coupled in series between the output node Vg and a second voltage rail (VDD in this case) and share a common voltage node 403. The voltage clamp 402 and switch S3 are coupled in series between the common voltage node 403 and a third voltage rail (labeled "VCC"). The voltage clamp 402 and switch S3 provide the gate-driving assistance to increase the gate-to-source voltage ($V_{gs}$) and reduce the switch ON resistance (e.g., the on-resistance of transistor M2) when switch S3 is closed.

Figure 4B:
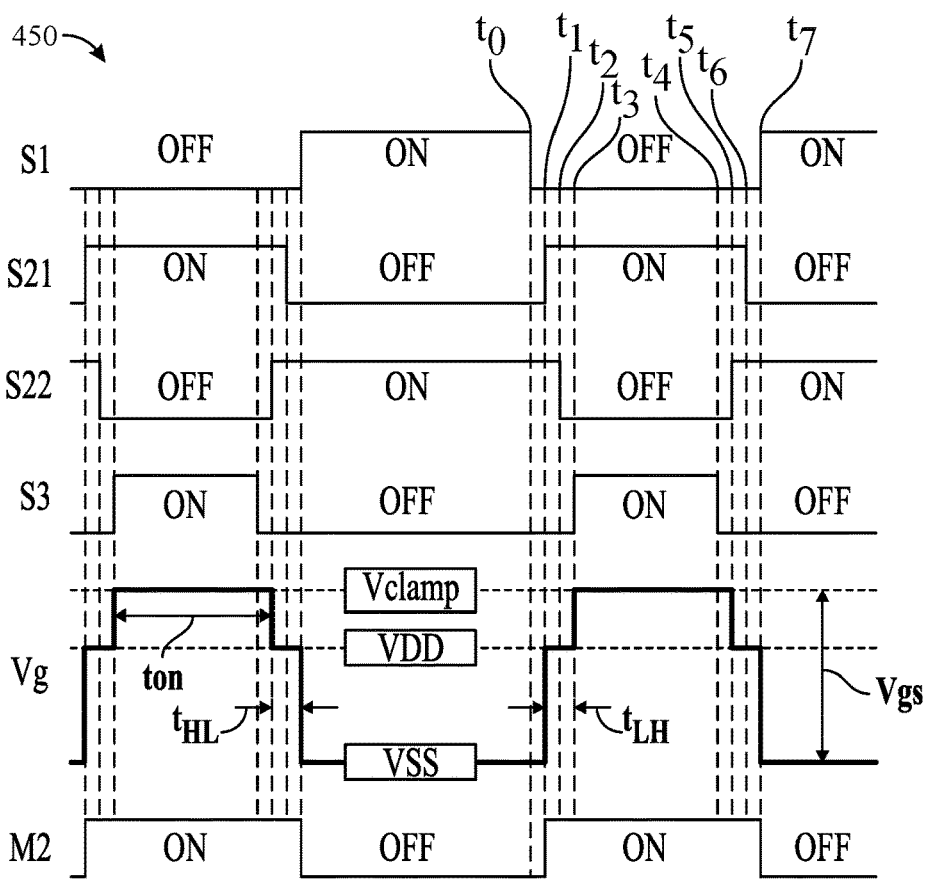
FIG. 4B is an example timing diagram for the portion of the gate driver of FIG. 4A, in accordance with certain aspects of the present disclosure.

FIG. 4B is an example timing diagram 450 for the portion of the gate driver 400 of FIG. 4A, in accordance with certain aspects of the present disclosure. After an initial fast transient is achieved between the VSS and VDD domains during a low-to-high transition interval ($t_{LH}$) for the gate voltage to turn on transistor M2, the transistor M2 $R_{ds,on}$ becomes smaller by further pulling up the gate voltage to Vclamp (>VDD) using the voltage clamp 402 during the on-time ($t_{on}$) for gate assistance, where Vclamp is the voltage at common voltage node 403. The gate-to-source voltage ($V_{gs}$) of transistor M2 should be clamped below its voltage rating ($V_{gs\_max}$) by the clamping circuit (e.g., voltage clamp 402) (e.g., Vclamp−VSS<$V_{gs\_max}$). Vclamp may be referenced to VSS such that Vclamp may be the clamping voltage of the voltage clamp 402 plus VSS.

The sequence for turning on power transistor M2 from an OFF state using the gate driver 400 is as follows. At t0, the control signal for switch S1 transitions to change switch S1 from the ON state to the OFF state, such that switch S1 is opened. At $t_1$, the control signal for switch S21 transitions to change switch S21 from the OFF state to the ON state, such that switch S21 is closed. Because switch S22 is already closed at $t_1$, transistor M2 turns on, with gate driving current flowing temporarily along charging path 404 from the second voltage rail (VDD) through switches S22 and S21 and transistor M2 to the first voltage rail (VSS). This also pulls the gate voltage at the output node Vg up from VSS to VDD as a fast transient at $t_1$, beginning the $t_{LH}$ interval. At $t_2$, the control signal for switch S22 transitions to change switch S22 from the ON state to the OFF state, such that switch S22 is opened. At $t_3$, the control signal for switch S3 is asserted to change switch S3 from the OFF state to the ON state, such that switch S3 is closed. This reroutes the gate driving current along charging path 406 through switch S3, the voltage clamp 402, switch S21, and transistor M2, pulling the gate voltage at node Vg up even further from VDD to Vclamp, where Vclamp is between VDD and VCC. The raising of the gate voltage to Vclamp at $t_3$ increases the Vgs (=Vclamp−VSS) and lowers the on-resistance of transistor M2 and ends the $t_{LH}$ interval.

The turn-on sequence (e.g., switch S1 opened→switch S21 closed→switch S22 opened→switch S3 closed) is opposite to the turn-off sequence (e.g., switch S3 opened-→switch S22 closed→switch S21 opened→switch S1 closed) for transistor M2. The sequence for turning off power transistor M2 from an ON state using the gate driver 400 is as follows. At $t_4$, the control signal for switch S3 is deasserted to change switch S3 from the ON state to the OFF state, such that switch S3 is opened, thereby ending the flow of current through charging path 406. The gate voltage at node Vg remains at or near Vclamp. At $t_5$, the control signal for switch S22 transitions to change switch S22 from the OFF state to the ON state, such that switch S22 is closed. Closing switch S22 at $t_5$ changes the gate voltage at node Vg from Vclamp to VDD, ends the period for gate assistance ($t_{on}$), and starts a high-to-low transition interval ($t_{HL}$) for the gate voltage to turn off transistor M2. At $t_6$, the control signal for switch S21 transitions to change switch S21 from the ON state to the OFF state, such that switch S21 is opened. At $t_7$, the control signal for switch S1 is asserted to change switch S1 from the OFF state to the ON state, such that switch S1 is closed. Closing switch S1 lowers the gate voltage at node Vg to VSS and, thus, turns off n-type transistor M2, transitioning transistor M2 from the ON state to the OFF state and ending the $t_{HL}$ interval.

The voltage clamp 402 may be implemented by any suitable voltage clamping circuit, without the burden of high current driving because the initial high current spike (i.e., the fast transient at $t_1$) to charge the gate capacitance of transistor M2 goes to the VDD domain, which may most likely be low impedance. Therefore, a large capacitor need not be included in the clamping circuit. The gate driving assistance circuit may be disabled (e.g., by opening switch S3 and/or disabling the voltage clamp 402) to reduce switching loss when sufficient $V_{gs}$ is available from high VDD or when meaningful $V_{gs}$ increase is unavailable due to low VCC.

Figure 4C:
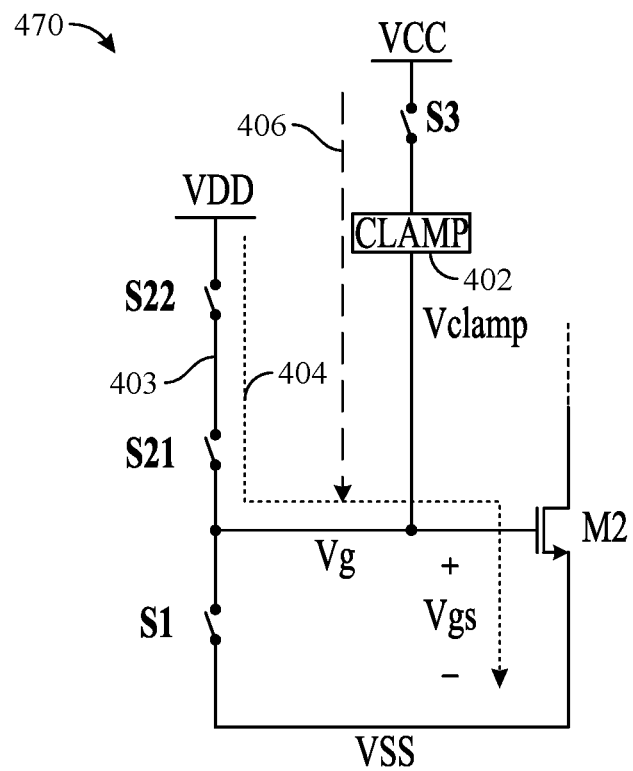

FIG. 4C is a circuit diagram for a portion of an example gate driver 470 for an n-type transistor (M2) of a switching converter, in accordance with certain aspects of the present disclosure. The gate driver 470 for the positive voltage domain is the counterpart of the gate driver 370 of FIG. 3C for the negative voltage domain. The gate driver 470 of FIG. 4C is similar to the gate driver 400 of FIG. 4A, but in this case, switch S3 and the voltage clamp 402 are coupled in series between the third voltage rail (labeled "VCC") and the gate driver output node Vg. The voltage clamp 402 and switch S3 provide the gate-driving assistance to increase $V_{gs}$ and reduce the switch ON resistance (e.g., the on-resistance of transistor M2) when switch S3 is closed. The example timing diagram 450 of FIG. 4B and the description thereof may also apply to the portion of the gate driver 470 of FIG. 4C.

FIGS. 5 and 6 are schematic diagrams of example switching converter applications using the gate driving helper circuits of FIGS. 3A and 4A, respectively, in accordance with certain aspects of the present disclosure. For example, FIG. 5 depicts an example power supply circuit 500 comprising an inverting buck-boost converter and the gate driver 300 of FIG. 3A. In this case, the gate of the high-side p-type transistor (transistor M0) is driven to a negative voltage domain (Vclamp<VSS=GND) using the negative output voltage VOUT as VEE. Switch S1 and the voltage clamp 302 are implemented as p-type transistors (e.g., PFETs), whereas switches S21, S22 and S3 are implemented as n-type transistors (e.g., NFETs). The NFET for switch S22 has a drain coupled to the second voltage rail (GND) and has a source coupled to the common voltage node 303. This arrangement keeps the body diode of the switch S22 NFET reverse-biased when switch S3 is closed. FIG. 5 may be modified to replace the gate driver 300 with the gate driver 370 of FIG. 3C.

As another example, FIG. 6 illustrates an example power supply circuit 600 comprising a boost converter and the gate driver 400 of FIG. 4A. In this instance, the gate of the low-side n-type transistor (transistor M2) is driven to Vclamp (>VDD) using a voltage (e.g., VCC=2VDD) higher than the input voltage (VDD). In the power supply circuit 600, switch S1 and the voltage clamp 402 are implemented as NFETs, whereas switches S21, S22 and S3 are implemented as PFETs. The PFET for switch S22 has a drain coupled to the second voltage rail (VDD) and has a source coupled to the common voltage node 403. This arrangement keeps the body diode of the switch S22 PFET reverse-biased when switch S3 is closed. FIG. 6 may be modified to replace the gate driver 400 with the gate driver 470 of FIG. 4C.

The gate driver architecture described herein offers several advantages including increased current-driving capability, greater efficiency (due to lower transistor on-resistance), and lower area (e.g., of the power FETs, the gate driver, the absence of high-voltage level shifters, and/or the voltage clamping circuit).

Example Operations for Supplying Power

Figure 7:
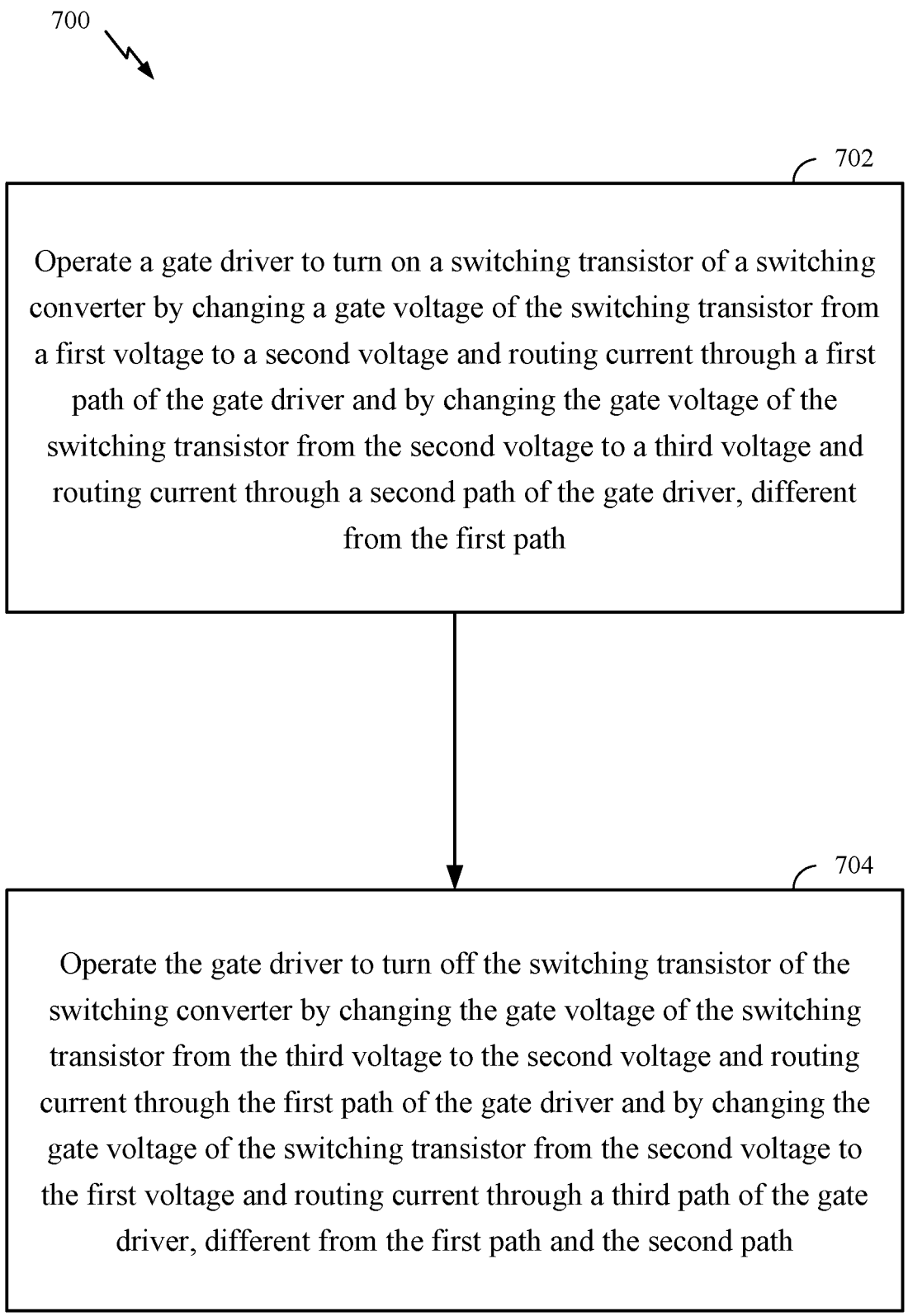
FIG. 7 is a flow diagram of example operations for supplying power, in accordance with certain aspects of the present disclosure.

FIG. 7 is a flow diagram of example operations 700 for supplying power, in accordance with certain aspects of the present disclosure. The operations 700 may be performed by a power supply circuit with a gate driver having a gate driving assistance circuit, such as gate drivers 300, 370, 400, 470 of FIGS. 3A, 3C, 4A, 4C, 5, and 6.

The operations 700 may begin, at block 702, with the power supply circuit operating a gate driver (e.g., the gate driver 300, 370, 400, or 470) to turn on a switching transistor (e.g., transistor M0 or M2) of a switching converter (e.g., the switching circuit 230). Operating the gate driver at block 702 may involve changing a gate voltage (Vg) of the switching transistor from a first voltage (e.g., VDD or VSS) to a second voltage (e.g., VSS or VDD) and routing charging current through a first path (e.g., charging path 304 or 404) of the gate driver. Operating the gate driver at block 702 may also involve changing the gate voltage of the switching transistor from the second voltage to a third voltage (e.g., Vclamp) and routing charging current through a second path (e.g., charging path 306 or 406) of the gate driver, different from the first path. The first path of the gate driver may be from a first voltage rail (e.g., VDD or VSS) at the first voltage to a second voltage rail (VSS or VDD) at the second voltage, and the second path of the gate driver may be from the first voltage rail at the first voltage to a third voltage rail (VEE or VCC) associated with the third voltage.

According to certain aspects, the switching transistor is a p-type transistor (e.g., a PFET), the second voltage is lower than the first voltage, and the third voltage is lower than the second voltage (e.g., Vclamp<VSS<VDD). For other aspects, the switching transistor is an n-type transistor (e.g., an NFET), the second voltage is higher than the first voltage, and the third voltage is higher than the second voltage (e.g., Vclamp>VDD>VSS).

According to certain aspects, the operations 700 may further include the power supply circuit operating the gate driver to turn off the switching transistor of the switching converter at block 704. Operating the gate driver at block 704 may involve changing the gate voltage of the switching transistor from the third voltage to the second voltage and routing charging current through the first path of the gate driver. Operating the gate driver at block 704 may also include changing the gate voltage of the switching transistor from the second voltage to the first voltage and routing charging current through a third path (e.g., through switch S1) of the gate driver, different from the first path and the second path.

According to certain aspects, changing the gate voltage of the switching transistor from the first voltage to the second voltage at block 702 involves opening a first switching device (e.g., switch S1) coupled between an output (e.g., on output node Vg) of the gate driver and a first voltage rail (e.g., VDD or VSS) at the first voltage; closing a second switching device (e.g., switch S21) coupled between the output of the gate driver and a voltage node (e.g., common voltage node 303 or common voltage node 403) of the gate driver; and closing a third switching device (e.g., switch S22) coupled between the voltage node of the gate driver and a second voltage rail (e.g., (VSS or VDD) at the second voltage. In this case, the first path of the gate driver may include the second switching device and the third switching device. For certain aspects, changing the gate voltage of the switching transistor from the second voltage to the third voltage at block 702 involves opening the third switching device and closing a fourth switching device (e.g., switch S3) coupled in series with a voltage clamp (e.g., voltage clamp 302 or 402). In some cases, the voltage clamp and the fourth switching device may be coupled between the voltage node and a third voltage rail (e.g., VEE or VCC) associated with the third voltage, while in other cases, the voltage clamp and the fourth switching device may be coupled between the output of the gate driver and a third voltage rail (e.g., VEE or VCC) associated with the third voltage. The second path of the gate driver may include the second switching device, the voltage clamp, and the fourth switching device. For other aspects, changing the gate voltage of the switching transistor from the second voltage to the third voltage at block 702 involves opening the third switching device and enabling a voltage clamp (e.g., voltage clamp 302 or 402). The voltage clamp may be coupled between the voltage node and a third voltage rail (e.g., VEE or VCC) associated with the third voltage. In this case, the second path of the gate driver may include the second switching device and the voltage clamp. For certain aspects, the operations 700 further involve at least one of disabling the voltage clamp or opening the fourth switching device, when a magnitude of a difference between the second voltage and the first voltage is sufficient for the gate voltage of the switching transistor. This may occur, for example, (1) when the magnitude of the voltage difference is sufficiently high enough for suitably low switching transistor on-resistance or (2) when a meaningful voltage increase cannot be achieved by the gate driving assistance circuit due to a low third voltage.

For certain aspects, the operations 700 may further involve operating the gate driver to turn off the switching transistor of the switching converter by changing the gate voltage of the switching transistor from the third voltage to the second voltage and routing charging current through the first path of the gate driver; and by changing the gate voltage of the switching transistor from the second voltage to the first voltage and routing charging current through a third path (e.g., through switch S1) of the gate driver, different from the first path and the second path. In this case, changing the gate voltage of the switching transistor from the third voltage to the second voltage may include opening the fourth switching device and closing the third switching device. For other aspects, changing the gate voltage of the switching transistor from the third voltage to the second voltage may include disabling the voltage clamp and closing the third switching device. Changing the gate voltage of the switching transistor from the second voltage to the first voltage may include opening the second switching device and closing the first switching device.

Example Aspects

In addition to the various aspects described above, specific combinations of aspects are within the scope of the disclosure, some of which are detailed below:

Aspect 1: A power supply circuit comprising: a switching converter having a switching transistor; and a gate driver having an output coupled to a gate of the switching transistor, the gate driver comprising: a first switching device coupled between the output of the gate driver and a first voltage rail; a second switching device coupled between the output of the gate driver and a voltage node of the gate driver; a third switching device coupled between the voltage node of the gate driver and a second voltage rail; and a voltage clamp coupled in series with a fourth switching device, the voltage clamp and the fourth switching device being coupled between the voltage node and a third voltage rail.

Aspect 2: The power supply circuit of Aspect 1, wherein: the switching transistor is a p-type transistor; the first voltage rail has a first voltage; the second voltage rail has a second voltage lower than the first voltage; and the third voltage rail has a third voltage lower than the second voltage.

Aspect 3: The power supply circuit of Aspect 2, wherein the first switching device comprises another p-type transistor and wherein the second, third, and fourth switching devices comprise n-type transistors.

Aspect 4: The power supply circuit of any preceding Aspect, wherein the switching converter comprises an inverting buck-boost converter and wherein the switching transistor comprises a high-side p-type transistor in the inverting buck-boost converter.

Aspect 5. The power supply circuit of any of Aspects 1-3, wherein the switching converter comprises a charge pump with the switching transistor.

Aspect 6: The power supply circuit of any preceding Aspect, wherein the third switching device comprises an n-type transistor having a drain coupled to the second voltage rail and having a source coupled to the voltage node.

Aspect 7: The power supply circuit of Aspect 1, wherein: the switching transistor is an n-type transistor; the first voltage rail has a first voltage; the second voltage rail has a second voltage higher than the first voltage; and the third voltage rail has a third voltage higher than the second voltage.

Aspect 8: The power supply circuit of Aspect 7, wherein the first switching device comprises another n-type transistor and wherein the second, third, and fourth switching devices comprise p-type transistors.

Aspect 9: The power supply circuit of Aspect 7 or Aspect 8, wherein the switching converter comprises a boost converter and wherein the switching transistor comprises a low-side n-type transistor in the boost converter.

Aspect 10: The power supply circuit of Aspect 7 or Aspect 8, wherein the switching converter comprises a buck converter and wherein the switching transistor comprises a low-side n-type transistor in the buck converter.

Aspect 11: The power supply circuit of Aspect 7 or Aspect 8, wherein the switching converter comprises a charge pump with the switching transistor.

Aspect 12: The power supply circuit of any of Aspects 7-11, wherein the third switching device comprises a p-type transistor having a drain coupled to the second voltage rail and having a source coupled to the voltage node.

Aspect 13: A power management integrated circuit (PMIC) comprising at least a portion of the power supply circuit of any preceding Aspect.

Aspect 14: A method of supplying power, comprising operating a gate driver to turn on a switching transistor of a switching converter by: changing a gate voltage of the switching transistor from a first voltage to a second voltage and routing current through a first path of the gate driver; and changing the gate voltage of the switching transistor from the second voltage to a third voltage and routing current through a second path of the gate driver, different from the first path.

Aspect 15: The method of Aspect 14, wherein changing the gate voltage of the switching transistor from the first voltage to the second voltage comprises: opening a first switching device coupled between an output of the gate driver and a first voltage rail at the first voltage; closing a second switching device coupled between the output of the gate driver and a voltage node of the gate driver; and closing a third switching device coupled between the voltage node of the gate driver and a second voltage rail at the second voltage, wherein the first path of the gate driver includes the second switching device and the third switching device.

Aspect 16: The method of Aspect 15, wherein changing the gate voltage of the switching transistor from the second voltage to the third voltage comprises: opening the third switching device; and closing a fourth switching device coupled in series with a voltage clamp, the voltage clamp and the fourth switching device being coupled between the voltage node and a third voltage rail associated with the third voltage, wherein the second path of the gate driver includes the second switching device, the voltage clamp, and the fourth switching device.

Aspect 17: The method of Aspect 16, further comprising operating the gate driver to turn off the switching transistor of the switching converter by: changing the gate voltage of the switching transistor from the third voltage to the second voltage and routing current through the first path of the gate driver; and changing the gate voltage of the switching transistor from the second voltage to the first voltage and routing current through a third path of the gate driver, different from the first path and the second path.

Aspect 18: The method of Aspect 17, wherein changing the gate voltage of the switching transistor from the third voltage to the second voltage comprises opening the fourth switching device and closing the third switching device.

Aspect 19: The method of Aspect 17 or Aspect 18, wherein changing the gate voltage of the switching transistor from the second voltage to the first voltage comprises opening the second switching device and closing the first switching device.

Aspect 20: The method of Aspect 15, wherein changing the gate voltage of the switching transistor from the second voltage to the third voltage comprises: opening the third switching device; and closing a fourth switching device coupled in series with a voltage clamp, the voltage clamp and the fourth switching device being coupled between the output of the gate driver and a third voltage rail associated with the third voltage, wherein the second path of the gate driver includes the voltage clamp and the fourth switching device.

Aspect 21: The method of Aspect 20, further comprising operating the gate driver to turn off the switching transistor of the switching converter by: changing the gate voltage of the switching transistor from the third voltage to the second voltage and routing current through the first path of the gate driver; and changing the gate voltage of the switching transistor from the second voltage to the first voltage and routing current through a third path of the gate driver, different from the first path and the second path.

Aspect 22: The method of Aspect 21, wherein changing the gate voltage of the switching transistor from the third voltage to the second voltage comprises opening the fourth switching device and closing the third switching device.

Aspect 23: The method of Aspect 21 or 22, wherein changing the gate voltage of the switching transistor from the second voltage to the first voltage comprises opening the second switching device and closing the first switching device.

Aspect 24: The method of any of Aspects 14-23, wherein the switching transistor is a p-type transistor, wherein the second voltage is lower than the first voltage, and wherein the third voltage is lower than the second voltage.

Aspect 25: The method of any of Aspects 14-23, wherein the switching transistor is an n-type transistor, wherein the second voltage is higher than the first voltage, and wherein the third voltage is higher than the second voltage.

Aspect 26: The method of any of Aspects 14-16, 18-20, and 22-25, further comprising operating the gate driver to turn off the switching transistor of the switching converter by: changing the gate voltage of the switching transistor from the third voltage to the second voltage and routing current through the first path of the gate driver; and changing the gate voltage of the switching transistor from the second voltage to the first voltage and routing current through a third path of the gate driver, different from the first path and the second path.

Aspect 27: The method of any of Aspects 14-26, wherein the first path of the gate driver is from a first voltage rail at the first voltage to a second voltage rail at the second voltage and wherein the second path of the gate driver is from the first voltage rail at the first voltage to a third voltage rail associated with the third voltage.

The various operations of methods described above may be performed by any suitable means capable of performing the corresponding functions. The means may include various hardware and/or software component(s) and/or module(s), including, but not limited to a circuit, an application-specific integrated circuit (ASIC), or a processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. A power supply circuit comprising:
  a switching converter having a switching transistor, wherein the switching transistor is an n-type transistor; and
  a gate driver having an output coupled to a gate of the switching transistor, the gate driver comprising:
    a first switching device coupled between the output of the gate driver and a first voltage rail, wherein the first voltage rail has a first voltage;
    a second switching device coupled between the output of the gate driver and a voltage node of the gate driver;
    a third switching device coupled between the voltage node of the gate driver and a second voltage rail, wherein the second voltage rail has a second voltage higher than the first voltage; and
    a voltage clamp coupled in series with a fourth switching device, the voltage clamp and the fourth switching device being coupled between a third voltage rail and either the voltage node or the output of the gate driver, wherein the third voltage rail has a third voltage higher than the second voltage.

2. The power supply circuit of claim 1, wherein:

the first switching device comprises another n-type transistor; and the second, third, and fourth switching devices comprise p-type transistors.

3. The power supply circuit of claim 1, wherein the switching converter comprises a boost converter and wherein the switching transistor comprises a low-side n-type transistor in the boost converter.

4. The power supply circuit of claim 1, wherein the switching converter comprises a buck converter and wherein the switching transistor comprises a low-side n-type transistor in the buck converter.

5. The power supply circuit of claim 1, wherein the switching converter comprises a charge pump with the switching transistor.

6. The power supply circuit of claim 1, wherein the third switching device comprises a p-type transistor having a drain coupled to the second voltage rail and having a source coupled to the voltage node.

7. A power management integrated circuit (PMIC) comprising at least a portion of the power supply circuit of claim 1.

* * * * *